(12) United States Patent
Ning

(10) Patent No.: US 9,653,149 B2
(45) Date of Patent: May 16, 2017

(54) COMPLEMENTARY BIPOLAR SRAM

(71) Applicant: International Business Machines Corporation, Armonk, NY (US)

(72) Inventor: Tak H. Ning, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 30 days.

(21) Appl. No.: 14/793,561

(22) Filed: Jul. 7, 2015

(65) Prior Publication Data

US 2016/0343427 A1 Nov. 24, 2016

Related U.S. Application Data

(63) Continuation of application No. 14/717,218, filed on May 20, 2015, now Pat. No. 9,336,860.

(51) Int. Cl.
 *G11C 11/00* (2006.01)
 *G11C 11/416* (2006.01)
 (Continued)

(52) U.S. Cl.
 CPC ............ *G11C 11/416* (2013.01); *G11C 11/411* (2013.01); *G11C 11/4116* (2013.01); *H01L 27/1025* (2013.01); *H01L 27/11* (2013.01)

(58) Field of Classification Search
 CPC ......... G11C 11/411; G11C 7/065; G11C 7/12; G11C 11/40
 See application file for complete search history.

(56) References Cited

U.S. PATENT DOCUMENTS 4,935,898 A 6/1990 Miyaoka et al.
5,959,334 A 9/1999 Maki et al.
(Continued)

FOREIGN PATENT DOCUMENTS

KR 100303362 B1 7/2001

OTHER PUBLICATIONS

Notice of Allowance dated Feb. 17, 2016, received in a related U.S. Appl. No. 14/717,218.
(Continued)

*Primary Examiner* — Tuan T Nguyen
(74) *Attorney, Agent, or Firm* — Scully, Scott, Murphy & Presser, P.C.; Louis J. Percello, Esq.

(57) ABSTRACT

A complementary lateral bipolar SRAM device and method of operating. The device includes: a first set and second set of lateral bipolar transistors forming a respective first inverter device and second inverter device, the first and second inverter devices being cross-coupled for storing a logic state. In each said first and second set, a first bipolar transistor is an PNP type bipolar transistor, and a second bipolar transistor is an NPN type bipolar transistor, each said NPN type bipolar transistor having a base terminal, a first emitter terminal, a second emitter terminal, and a collector terminal. Emitter terminals of the PNP type transistors of each first and second inverter devices are electrically coupled together and receive a first applied wordline voltage. The first emitter terminals of each said NPN transistors of said first inverter and second inverter devices are electrically coupled together and receive a second applied voltage. The second emitter terminal of one NPN bipolar transistor of said first inverter is electrically coupled to a first bit line conductor, and the second emitter terminal of the NPN bipolar transistor of said second inverter device is electrically coupled to a second bit line.

9 Claims, 8 Drawing Sheets

(51) Int. Cl.
*G11C 11/411* (2006.01)
*H01L 27/11* (2006.01)
*H01L 27/102* (2006.01)

(56) References Cited

U.S. PATENT DOCUMENTS

| | | | |
|---|---|---|---|
| 6,111,780 | A | 8/2000 | Bertin |
| 6,434,041 | B2 | 8/2002 | Forbes |
| 6,462,584 | B1 * | 10/2002 | Proebsting ............. G11C 7/065 365/203 |
| 7,072,234 | B1 * | 7/2006 | Nierle ...................... G11C 8/08 365/201 |
| 7,782,646 | B2 | 8/2010 | Lam et al. |
| 8,339,873 | B1 * | 12/2012 | Morton .................... G11C 7/06 365/189.15 |
| 8,526,220 | B2 | 9/2013 | Cai et al. |
| 8,531,001 | B2 | 9/2013 | Cai et al. |
| 8,929,133 | B2 | 1/2015 | Cai et al. |
| 8,933,536 | B2 | 1/2015 | Lung et al. |
| 2011/0157964 | A1 * | 6/2011 | McPartland .......... G11C 11/412 365/156 |
| 2012/0314485 | A1 | 12/2012 | Cai et al. |
| 2013/0335875 | A1 | 12/2013 | Baumann |
| 2014/0003175 | A1 * | 1/2014 | Jung ........................ G11C 7/02 365/203 |
| 2014/0153328 | A1 * | 6/2014 | Cai ....................... G11C 11/411 365/177 |
| 2014/0154845 | A1 | 6/2014 | Cai et al. |
| 2015/0009772 | A1 * | 1/2015 | Chen .................... G11C 11/417 365/227 |

OTHER PUBLICATIONS

KR100303362B1 English language Abstract, Jul. 10, 2001.
List of IBM Patents or Patent Applications Treated as Related.

* cited by examiner

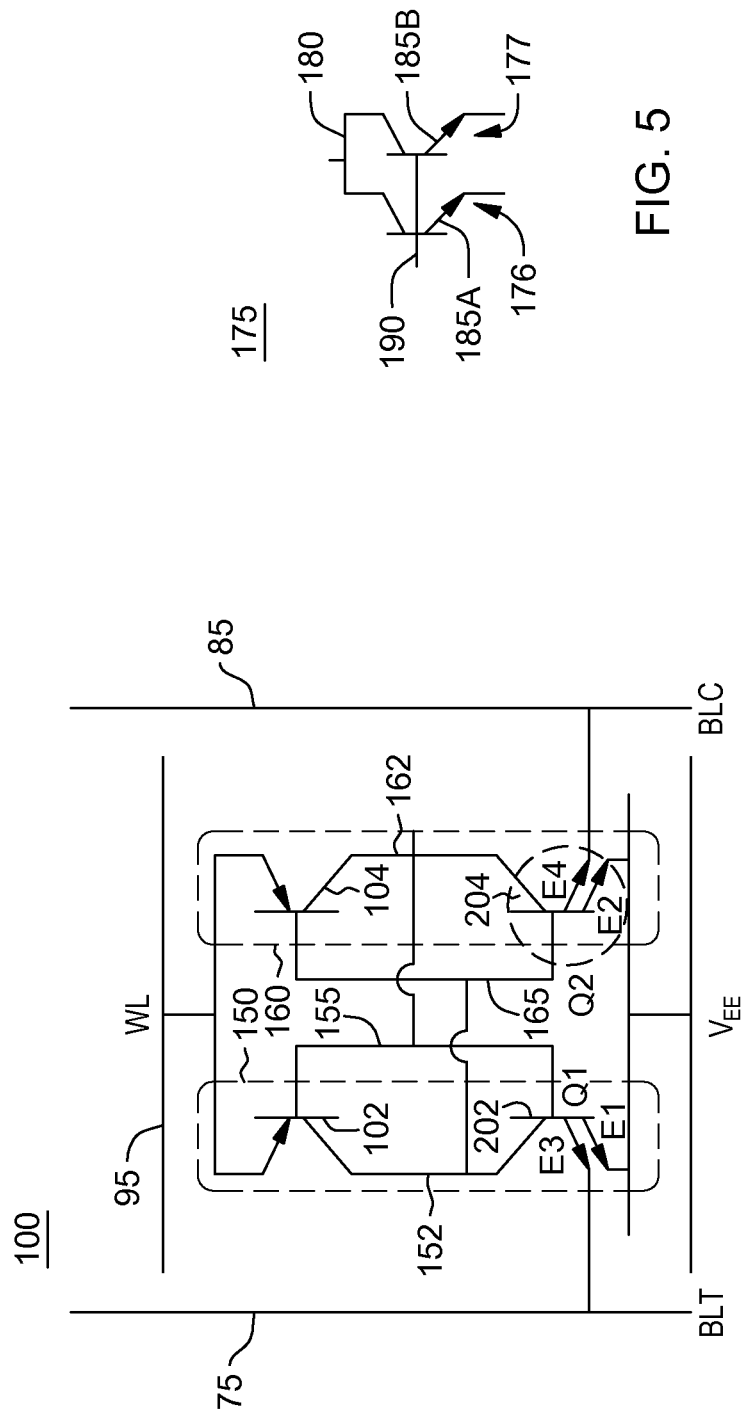

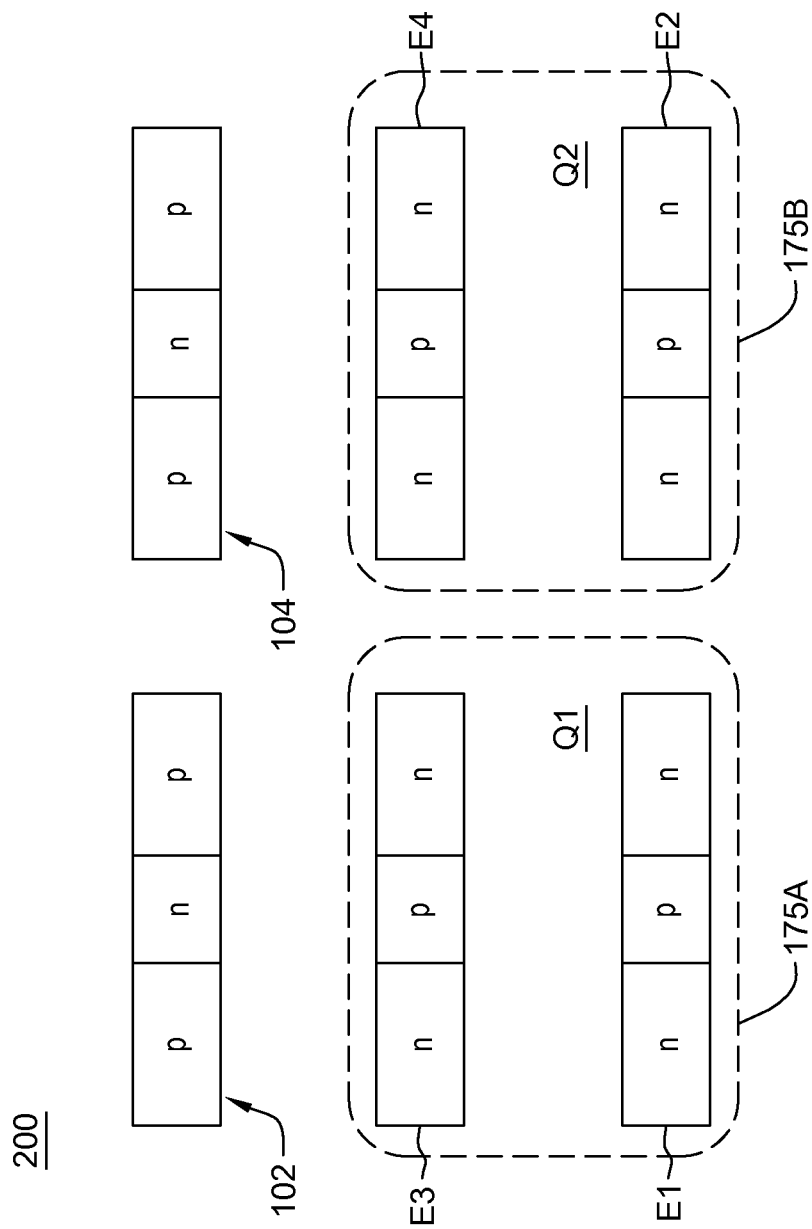

US 9,653,149 B2

COMPLEMENTARY BIPOLAR SRAM

CROSS REFERENCE TO RELATED APPLICATION

This application is a continuation of U.S. patent application Ser. No. 14/717,218, filed May 20, 2015 the entire content and disclosure of which is incorporated herein by reference.

BACKGROUND

The present invention relates generally to transistor devices, and in particular a complementary bipolar SRAM, and a method of building and operating a complementary bipolar SRAM.

Semiconductor-on-Insulator (SOI) lateral bipolar transistors are ideally suitable for building complementary bipolar inverters, which is the basic building block for complementary bipolar circuits. The teaching of a complementary lateral bipolar inverter using SOI can be found in U.S. Pat. No. 8,531,001.

FIG. 1 shows a SOI lateral bipolar inverter device 10 according to prior art implementations. In FIG. 1 the SOI lateral bipolar junction transistor (BJT) device 10 includes a first bipolar (P-N-P) transistor 12 and a second bipolar (N-P-N) transistor 15 formed on an SOI substrate 11. In the device 10, the base terminal of the PNP bipolar junction transistor 12 is electrically connected with the base terminal of the NPN bipolar junction transistor 15. The emitter terminal of the bipolar junction transistor 12 is tied to a supply voltage source $V_{CC}$ and the emitter terminal of the bipolar junction transistor 15 is tied to a ground reference. Further, the collector terminal of the PNP bipolar junction transistor 12 is electrically connected with the collector terminal of the NPN bipolar junction transistor 15 and form an SOI lateral bipolar inverter device 10 output.

FIG. 2 shows a pair of complementary bipolar inverters cross-coupled to form a bistable memory element (cell) 55 with relatively large noise margin. In the cross-coupled implementation shown, the memory element 55 includes a first set of lateral bipolar transistors 32 fabricated on the SOI substrate and a second set of lateral bipolar transistors 42 fabricated on the SOI substrate. As discussed above, the first set of lateral bipolar transistors 32 is configured to form a first inverter device 50 and the second set of lateral bipolar transistors 42 is configured to form a second inverter 60. Furthermore, the first inverter 50 is cross-coupled to the second inverter 60 such that a first input terminal 51 to the first inverter 50 is electrically coupled to a second output terminal 62 of the second inverter 60, and the second input terminal 61 of the second inverter 60 is electrically coupled to the output terminal 52 of the first inverter 50. In this configuration, the cross-coupled inverters act as a memory element for storing a logic state, e.g., a logic "1" or logic "0".

As shown in FIG. 3, a memory cell 55' includes the memory element 55 of FIG. 2 and further includes: first access transistor 74 controlling electrical impedance from the first inverter 50 to a bit line true (BLT) conductor 75, and second access transistor 76 controlling electrical impedance from the second inverter 60 to bit line complement (BLC) conductor 85. In one embodiment, the first and second access transistors 74 and 76 are field effect transistors (FETs). For example, the first and second access transistors 74 and 76 may be n-channel FETs or p-channel FETs. Additionally, each of the first and second access transistors 74 and 76 include a gate terminal coupled to a word line 95. Such a configuration is taught and described in U.S. Pat. No. 8,526,220.

In the circuit 55' of FIG. 3, in a standby mode, the voltage at $V_{DD}$ is lowered (e.g., 0.5 Volts) to take advantage of the memory element's noise margin characteristics. Furthermore, a voltage $V_{EE}$ is set to 0 Volts. The wordline 95 is also set to 0 Volts, thereby turning off the access transistors 74 and 76.

In the prior art circuit of FIG. 3, during a memory write operation, $V_{EE}$ is set to 0 Volts. BLT 75 voltage is set to the desired binary value to be stored. Likewise, BLC 85 is set to the complement of the desired binary value to be stored. The wordline 95 is then raised to $V_{DD}$ so that the memory cell 55 is overwritten with the desired binary value.

During a memory read operation, $V_{EE}$ is pulled negative to avoid read disturb. In other words, the inverter circuits 50 and 60 must carry enough current to supply the FET current to maintain memory cell stability. In general, the larger the voltage difference between $V_{CC}$ and $V_{EE}$, the more current the bipolar inventors can supply. The word line 95 corresponding to the memory cell 55' is then set so that the access transistors 74 and 76 are activated. Sense amplifiers (not shown) coupled to the memory cell's BLT 75 and BLC 85 lines are then used to detect the logic value stored in the memory cell 55'.

The memory cell 55' according to prior art implementation of FIG. 3 requires a BiCMOS process, i.e. a manufacturing process that integrates both SOI lateral bipolar inverters and MOSFETs on the same substrate, to build the SRAM which, as known, is not cost-effective.

BRIEF SUMMARY

In an aspect of the present disclosure, there is provided a complementary Bipolar SRAM memory cell.

In a further aspect of the present disclosure, there is provided a complementary Bipolar SRAM memory element formed of a cross-coupled bipolar inverter pair as memory element, and having NPN bipolar junction transistors as access devices, thereby avoiding BiCMOS processes and just requiring a complementary bipolar device manufacturing process.

Thus, in one embodiment, there is provided a complementary Static Random Access Memory (SRAM) device. The device comprises: a first set of lateral bipolar transistors fabricated on a semiconductor substrate, the first set of lateral bipolar transistors forming a first inverter device, and a second set of lateral bipolar transistors fabricated on the semiconductor substrate, the second set of lateral bipolar transistors forming a second inverter device, the first inverter device and second inverter device in a cross-coupled configuration to store a logic state; a first bipolar transistor of each the first set and second set being an PNP type bipolar transistor having a base terminal, an emitter terminal and a collector terminal, and a second bipolar transistor of each the first set and second set being an NPN type bipolar transistor having a base terminal, a first emitter terminal, a second emitter terminal, and a collector terminal, a first conductor electrically coupling an emitter terminal of the PNP type transistor of the first inverter device and the emitter terminal of the PNP type transistor of the second inverter device, the first conductor adapted to receive a first applied voltage; and a second conductor electrically coupling the first emitter terminal of the NPN transistor of the first inverter device and the first emitter terminal of the NPN transistor of the second inverter device, the second conductor adapted to receive a second applied voltage, wherein one NPN type transistor of either the first inverter device or second inverter device becomes turned on activated responsive to application of the first voltage and second voltage such that electrical current flows through the first emitter terminal of the activated NPN transistor device to the second conductor, and wherein the stored logic state is accessed via the second emitter terminals of both the NPN bipolar transistors of the first inverter and second inverter devices.

In this embodiment, the second emitter terminal of the NPN bipolar transistor of the first inverter device is electrically coupled to a bit line true conductor (BLT) for controlling electrical impedance from the first inverter to the BLT conductor, and the second emitter terminal of the NPN bipolar transistor of the second inverter device is electrically coupled to a bit line complement conductor (BLC) for controlling electrical impedance from the second inverter device to the BLC conductor, each the BLT and BLC conductors used to access the stored logic state.

In a further aspect, there is provided a method for manufacturing a memory cell comprising: forming a first set of lateral bipolar transistors on a semiconductor substrate, the first set of lateral bipolar transistors forming a first inverter device, and forming a second set of lateral bipolar transistors on the substrate, the second set of lateral bipolar transistors forming a second inverter device, wherein a first bipolar transistor of each the first set and second set is an PNP type bipolar transistor having a base terminal, an emitter terminal and a collector terminal, and a second bipolar transistor of each the first set and second set being an NPN type bipolar transistor having a base terminal, a first emitter terminal, a second emitter terminal, and a collector terminal, the first inverter device and second inverter device configured in a cross-coupled configuration to store a logic state; forming a first conductor layer that electrically couples the emitter terminal of the PNP type transistor of the first inverter device to the emitter terminal of the PNP type transistor of the second inverter device; forming a second conductor layer that electrically couples the first emitter terminal of the NPN transistor of the first inverter device to the first emitter terminal of the NPN transistor of the second inverter device; and forming a third conductor layer that electrically couples the second emitter terminal of the NPN bipolar transistor of the first inverter to a bit line true (BLT) conductor; and forming an fourth conductor layer that electrically couples the second emitter terminal of the NPN bipolar transistor of the second inverter device to a bit line complement (BLC) conductor.

In still another aspect, there is provided a method of operating a memory cell. The memory cell comprises: a first set of lateral bipolar transistors fabricated on a semiconductor substrate, the first set of lateral bipolar transistors forming a first inverter device, and a second set of lateral bipolar transistors fabricated on the semiconductor substrate, the second set of lateral bipolar transistors forming a second inverter device, the first inverter device and second inverter device in a cross-coupled configuration to store a logic state; a first bipolar transistor of each the first set and second set being an PNP type bipolar transistor having a base terminal, an emitter terminal and a collector terminal, and a second bipolar transistor of each the first set and second set being an NPN type bipolar transistor having a base terminal, a first emitter terminal, a second emitter terminal, and a collector terminal, a first conductor electrically coupling an emitter terminal of the PNP type transistor of the first inverter device and the emitter terminal of the PNP type transistor of the second inverter device, the first conductor adapted to receive a first applied voltage; and a second conductor electrically coupling the first emitter terminal of the NPN transistor of the first inverter device and the first emitter terminal of the NPN transistor of the second inverter device, the second conductor adapted to receive a second applied voltage, wherein the second emitter terminal of the NPN bipolar transistor of the first inverter device is electrically coupled to a bit line true conductor (BLT) for controlling electrical impedance from the first inverter to the BLT conductor, and the second emitter terminal of the NPN bipolar transistor of the second inverter device is electrically coupled to a bit line complement conductor (BLC) for controlling electrical impedance from the second inverter device to the BLC conductor, each the BLT and BLC conductors used to access the stored logic state, wherein the method comprises: applying a first voltage to the first conductor; applying a second voltage to the second conductor, wherein one PNP type transistor of either the first inverter device or second inverter device becomes activated responsive to application of the first voltage and second voltage such that electrical current flows through the first emitter terminal of one NPN type transistor of either the first inverter device or second inverter device to the second conductor, and applying a further voltage to each the respective the BLT conductor and BLC conductor to write a logic state value to or read a logic state value from the memory cell.

BRIEF DESCRIPTION OF THE SEVERAL VIEWS OF THE DRAWINGS

These and other objects, features and advantages of the present invention will become apparent from the following detailed description of illustrative embodiments thereof, which is to be read in connection with the accompanying drawings. The various features of the drawings are not to scale as the illustrations are for clarity in facilitating one skilled in the art in understanding the invention in conjunction with the detailed description. In the drawings:

FIG. 4 depicts the Complementary Bipolar SRAM cell that avoids BiCMOS processing according to one embodiment;

FIG. 5 shows in greater detail a multi-emitter BJT device that functions as the two-emitter bipolar transistor (labeled Q1) of a first inverter, and the two-emitter bipolar transistor (labeled Q2) of a second inverter;

FIG. 6A shows, in a method using standard lithography and semiconductor manufacturing technique, a layout of the transistors in the Complementary Bipolar SRAM cell of FIG. 4;

DETAILED DESCRIPTION

Figure 2:
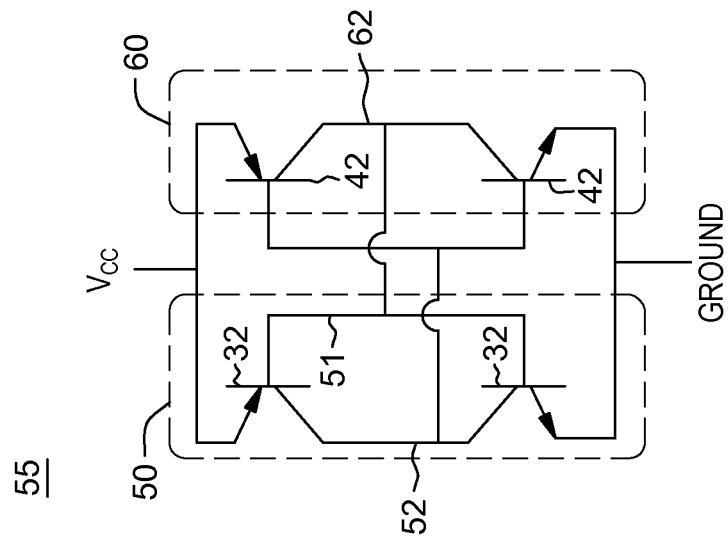
FIG. 2 shows a pair of complementary bipolar inverters cross-coupled to form a bistable memory element (cell) according to the prior art.
Figure 1:
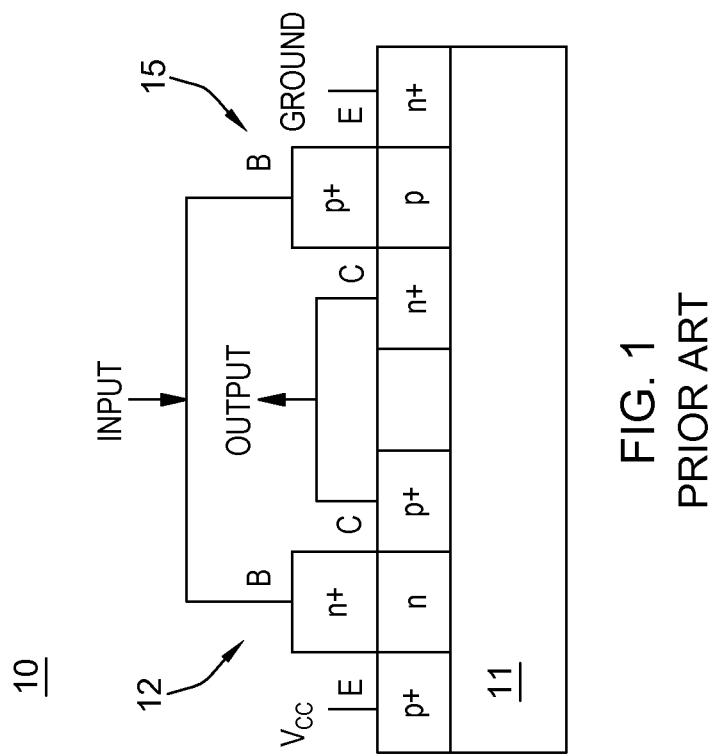
FIG. 1 shows a SOI lateral bipolar inverter device 10 according to a prior art implementation.

Aspects of the present disclosure are now described in detail with accompanying figures. It is noted that like reference numerals refer to like elements across different embodiments. The drawings are not necessarily drawn to scale. As used herein, ordinals such as "first," "second," and "third," etc. are employed to distinguish similar elements, and a same element may be labeled with different ordinals across the specification and the claims.

The present disclosure is directed to a Complementary Bipolar SRAM that avoids BiCMOS processing.

The current invention is an all bipolar SRAM cell, using cross-coupled complementary semiconductor-on-insulator (SOI) lateral bipolar transistors as SRAM memory element, and NPN bipolar transistors as access transistors. No BiCMOS processing is required in its manufacture-only SOI lateral bipolar transistors are formed at a lower cost.

FIG. 4 shows an embodiment of the SOI lateral bipolar junction transistor (BJT) memory cell 100 that employs only lateral bipolar technology in its production. This memory cell 100 is an SOI lateral bipolar inverter device including a pair of complementary bipolar inverters cross-coupled to form a bistable memory element (cell). In the cross-coupled implementation shown, the memory cell 100 includes a first set of lateral bipolar transistors 102, 202 fabricated on the SOI substrate and a second set of lateral bipolar transistors 104, 204 fabricated on the SOI substrate. The first set of lateral bipolar transistors 102, 202 are configured to form a first inverter device 150 and the second set of lateral bipolar transistors 104, 204 are configured to form a second inverter 160. Furthermore, the first inverter 150 is cross coupled to the second inverter 160 such that a first input terminal 155 is electrically coupled to a second output terminal 162 and the second input terminal 165 is electrically coupled to the first output terminal 152.

Figure 3:
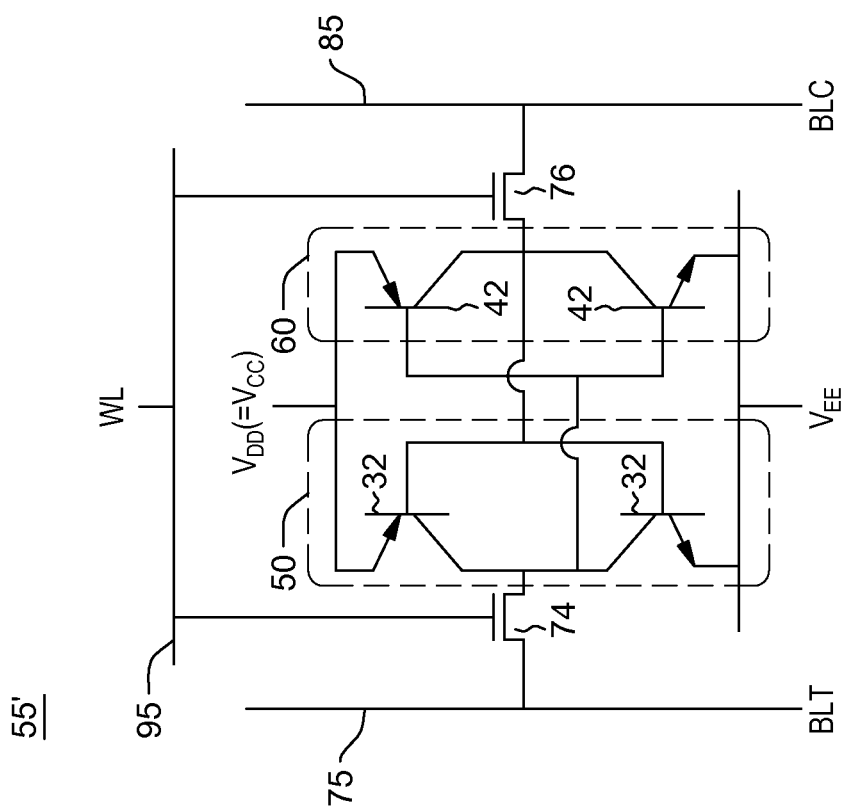
FIG. 3 shows the prior art memory cell of FIG. 2 including access FET transistors for controlling electrical impedance from the inverters to respective bit line true (BLT) and bit line complement (BLC) conductors.

In the first inverter device 150, BJT transistor 102 is an PNP type and BJT transistor 104 in the second inverter device 160 is also an PNP type. However, in the embodiment of FIG. 4, the paired lateral bipolar transistor set of inverter 150 includes a two-emitter NPN type transistor Q1 202, having emitters labeled E1 and E3. Likewise, in the embodiment of FIG. 4, the paired lateral bipolar transistor set of inverter 160 includes a two-emitter NPN type transistor Q2 204, having emitters labeled E2 and E4. Thus, as compared to the prior art device 55' of FIG. 3, the FET access transistor 74 is replaced by an NPN device 202 having a second emitter terminal connected to respective BLT line, and the FET access transistor 76 is replaced by an NPN device 204 having a second emitter terminal connected to respective BLC line.

FIG. 5 shows in greater detail a multi-emitter BJT device 175 that functions as the two-emitter NPN bipolar transistor 202 (labeled Q1) of inverter 150, and the two-emitter NPN bipolar transistor 204 (labeled Q2) of inverter 160. As shown in FIG. 5, the multi-emitter BJT device 175 forming inverter elements 202 and 204, includes two-BJT transistors 176, 177 connected in parallel, with a common collector 180 and a common base terminal 190. With device 175 of FIG. 5 employed as multi-emitter transistor 202 of the first inverter 150, the emitter terminals 185A, 185B of respective parallel transistors 176, 177, form respective emitters E3 and E1 of transistor 202. Likewise, with device 175 employed as multi-emitter transistor 204 of the second inverter 160, the emitter terminals 185A, 185B of respective parallel transistors 176, 177, form respective emitters E2 and E4 of transistor 204.

Thus, returning to FIG. 4, in inverter device 150, the emitter terminal E3 (of first transistor Q1), e.g., corresponding to emitter terminal 185B of device 175 shown in FIG. 5, is electrically coupled to the BLT bit line 75, while the emitter terminal E1 (of first transistor Q1) of inverter 150, e.g., corresponding to emitter terminal 185A of device 175 shown in FIG. 5, is electrically coupled to the $V_{EE}$ voltage supply line. The emitter terminal E1 (of first transistor Q1) of inverter 150 is additionally electrically coupled to the corresponding emitter terminal E2 (of second transistor Q2) of cross-coupled inverter 160.

Further, in view of FIG. 4, in inverter device 160, the emitter terminal E4 (of second transistor Q2), e.g., corresponding to emitter terminal 185B of device 175 shown in FIG. 5, is electrically coupled to the BLC bit line 85, while the emitter terminal E2 (of transistor Q2), e.g., corresponding to emitter terminal 185A of device 175 shown in FIG. 5, is electrically coupled to the $V_{EE}$ voltage supply line. The emitter terminal E2 (of transistor Q2) of inverter 160 is additionally electrically coupled to the corresponding emitter terminal E1 (of first transistor Q1) of cross-coupled inverter 150.

Focusing on each cross-coupled inverter, e.g., inverters 150, 160, in each respective Q1, and Q2, the two emitters are separate, i.e., each passes current separately. Typically current carried by the emitter increases exponentially with qV/kT (a dimensionless ratio) where k is the Boltzmann constant, T is a temperature value, q is an electrical charge and V is a voltage across the emitter-base diode of the transistor. Here the base voltage of multi-emitter BJT device Q1 is common to both emitters E1 and E3, however, the base-emitter voltages of Q1 are separately controllable, by modifying either the BLT voltage on BLT line 75 relative to the $V_{EE}$ voltage and/or modify the $V_{EE}$ voltage relative to the BLT voltage. Thus, given E1=0 and E3=0, then the transistor Q1 will have the same base-emitter voltage ($V_{BE}$) for emitter E1 and emitter E3 and equal currents will pass through E1 and E3. If emitter voltage at E3>>E1 then the voltage $V_{BE\ 3}$ becomes larger than $V_{BE\ 1}$ and more current will pass through E3 of Q1 as compared to current passing through E1 of Q1. Similarly, the base voltage of multi-emitter BJT device Q2 is common to both emitters E2 and E4, however, the base-emitter voltages of Q2 are separately controllable, by modifying either the BLC voltage on BLC line 85 relative to the $V_{EE}$ voltage and/or modify the $V_{EE}$ voltage relative to the BLC voltage. Thus, given E2=0 and E4=0, then the transistor Q2 will have the same base-emitter voltage ($V_{BE}$) for emitter E2 and emitter E4 and equal currents will pass through E2 and E4. If emitter voltage at E4>>E2 then the voltage $V_{BE\ 4}$ becomes larger than $V_{BE\ 2}$ and more current will pass through E4 of Q2 as compared to current passing through E2 of Q2. For example, at room temperature (T), a delta voltage increase of about 60 millivolts (60 mV) at a VBE will cause approximately a ten-fold increase in current flowing through the transistor's corresponding emitter terminal. Similarly, a delta voltage decrease of about 60 millivolts (60 mV) at a VBE will cause approximately a ten-fold decrease in the amount of current flowing through the transistor's corresponding emitter terminal.

Thus, assuming that each of the dual BJT transistors 175 of FIG. 5 have identical geometries, given 1 milliamp passing through the collector, the proportion of current through each emitter will depend on the respective voltage across the respective base-emitter terminal. If the VBE at each terminal is the same (E1 and E3 at same voltage), then roughly equal current amounts will pass through each emitter (e.g., 0.5 milliamp). To provide current in an emitter terminal to 90% of the 1 milliamp, e.g., $V_{BE\;3}$ for emitter E3 of FIG. 4 is brought much larger than $V_{BE\;1}$ for emitter E1 ($V_{BE\;3}>>V_{BE\;1}$), e.g., $V_{BE\;3} \geq V_{BE\;1}+60$ mV. Similarly, if the VBE at each terminal is the same (E2 and E4 at same voltage), then roughly equal current amounts will pass through each emitter (e.g., 0.5 milliamp). To provide current in an emitter terminal to 90% of 1 milliamp, e.g., $V_{BE\;4}$ for emitter E4 of FIG. 4 is brought much larger than $V_{BE\;2}$ for emitter E2 ($V_{BE\;4}>>V_{BE\;2}$), e.g., $V_{BE\;4} \geq V_{BE\;2}+60$ mV. The dependence of current flow upon the geometry of the BJT is relatively small.

Operations employing the complementary Bipolar SRAM cell 100 of FIG. 4, are now described. Typically, in operation of the memory cell 100, either the cross-coupled inverter 150 side (Q1) is "on" and the other inverter 160 (Q2) is "off" to program one bit value; or alternately, the cross-coupled inverter 160 side (Q2) is on and the other inverter 150 (Q1) is off to program a complement bit value.

In one embodiment, to place the memory cell 100 in a standby mode, with BJT transistor Q1 being turned "on," the WL voltage applied is programmed at some hold voltage above the voltage $V_{EE}$, while bitlines BLT 75 and BLC 85 are kept at a voltage of at least several kT/q volts above the $V_{EE}$. For example: grounding or programming supply line voltage line $V_{EE}=0$ V, and programming the WL voltage 95 (i.e., $V_{WL}$) at approximately 0.5 V, and programming the voltage at the BLT ($V_{BLT}$) at approximately 1 V and at the BLC ($V_{BLC}$) at approximately 1 V renders device 100 in a stand-by mode of operation. That is, given these input voltages, the voltage at the base of Q1, i.e., VB(Q1), is equal to the voltage at the WL, i.e., $V_{BE\;1}=V_{WL}=0.5$ V; the voltage at the base of Q2, i.e., VB(Q2) is equal to the voltage $V_{EE}=0$ V. Thus, with Q1 transistor "on," current flows through E1 to $V_{EE}$, no current flows through E3 as the $V_{BE\;3}<<V_{BE\;1}$. With transistor Q2 off, no current is flowing through E2 and E4. In one embodiment, a lower range between $V_{WL}$ and $V_{EE}$ (voltage difference) is about 0.25 volts, e.g., $V_{EE}$ is at 0 V and $V_{WL}$ is about 0.2-0.25 Volts. In one embodiment, a maximum value for $V_{WL}$ may be about 1.0 volts.

It is noted that, in a standby operation, the programming of the E3 is such that the emitter-base diode for E3 is reverse biased, i.e., no current flow through the E3 emitter of Q1; and likewise, no current flows through the E2 because $V_{BE\;2}=0$, and no current flows through E4 because the emitter-base diode for E4 is reverse biased.

A further operation employing the complementary Bipolar SRAM cell 100 of FIG. 4 is to select all cells connected to a wordline, WL. In an example operation to select a word line, the WL voltage at selected wordline, e.g., WL 95 is placed at about 1V and the VEE is placed at about 0.6 V. Other non-selected WL voltages of other wordlines having connected cells (shown in FIG. 7) are brought to about 0.5 volts and the $V_{EE}$ voltage supplied to the transistors coupled to the non-selected WL are placed at 0.0 Volts. In this embodiment, for each of the memory cells 100 connected to the selected wordline, the corresponding BLT and BLC voltages are programmed to remain in their standby mode voltages (e.g., the BLT (VBLT)=1 V and the BLC (VBLC)=1 V) such that no current flows in the BLT 75 and BLC 85 lines for the selected cell. Here, the BLC and BLT voltages (in stand by mode) are caused to be equal to or larger than the voltage at the wordline ($V_{WL}$) and greater than $V_{EE}$ such that Q1 is on with current only flowing through emitter terminal E1 and BJT transistor Q2 is off, no current flows through E2, E3, E4.

In this embodiment, the voltage across the cross-coupled inverter of the selected cells is about 0.4 volts, i.e., $V_{WL}-V_{EE}=1.0$ V−0.6 V=0.4 V. However, the voltage across the cross-coupled inverter of the non-selected cells is about 0.5 volts, i.e., $V_{WL}-V_{EE}=0.5$ V−0 V=0.5 V. Thus, to select cells of a wordline, the difference between wordline voltage $V_{WL}$ and $V_{EE}$ is smaller than the difference between the wordline voltage $V_{WL}$ and $V_{EE}$ of the non-selected WL cells. In this example, the $V_{WL}-V_{EE}$ difference (e.g., 0.4 V) across the latch of cells coupled to a selected wordline is about 100 mV less than the $V_{WL}-V_{EE}$ difference (e.g., 0.5 V) across the latch of cells coupled to a non-selected wordline. This 100 mV reduced voltage difference for the selected wordline cells is exemplary, however, this reduced difference may range between 50 mV to 200 mV.

In this embodiment, while cell 100 is in the standby mode, the wordline voltage is raised to 1 V, i.e., $V_{WL}=1.0$ V and the $V_{EE}$ line is at about 0.6 V. In doing this, the base voltage VB(Q1) of the on transistor Q1 follows $V_{WL}$ voltage and reach about 1.0 V while the base voltage VB(Q2) of the off transistor Q2 follows $V_{EE}$ and reach about 0.6 V. As a result, the $V_{BE2}$ voltage is zero volts, i.e., VB (Q2)−VEE=0.6 V−0.6 V=0 V (i.e., Q2 is off).

A further operation employing the complementary Bipolar SRAM cell 100 of FIG. 4 is to read a stored logic state (bit) value from the selected cell. For purposes of description, it is assumed that a read operation is performed at cells of a selected wordline WL 95, with BJT transistor Q1 turned on, and BJT transistor Q2 is turned off. Here, both applied wordline voltage $V_{WL}$ and $V_{EE}$ supply voltages have been raised (e.g., when the cell was selected). For example, wordline voltage has been raised to 1 V, i.e., $V_{WL}=1.0$ V and the $V_{EE}$=is about 0.6 V. In doing this, the "on" transistor Q1 has a base voltage VB(Q1)=1 V, while the "off" transistor Q2 has a base voltage VB(Q2)=0.6 V.

In this embodiment, to read a selected cell, BLT voltage 75 and BLC voltage 85 are both lowered to a value slightly less than their respective standby mode WL voltage value, e.g., to 0.4 V. From their standby values, a reduction ranging anywhere between 0.08 V to 0.120 V would be an adequate voltage reduction for reading a cell bit value from a standby state. Thus, the $V_{BE\;3}$ (i.e., base-emitter voltage at Q1 emitter E3) now has a value of 0.6 V, i.e., VB(Q1)−$V_{BLT}$=1.0−0.4=0.6 volts causing a current to flow in BLT, while the $V_{BE\;4}$ (i.e., base-emitter voltage at Q2 emitter E4) now has a value of only 0.2 V, i.e., VB(Q2)−$V_{BLC}$=0.6−0.4=0.2 volts, resulting in negligible current flow in BLC. In this embodiment, the $V_{BE\;1}$ (i.e., base-emitter voltage at Q1 emitter E1) is a value 0.4 V, i.e., VB(Q1)−$V_{EE}$=1.0−0.6=0.4 volts (Q1 is turned on). Further, the $V_{BE\;4}$ (i.e., base-emitter voltage at Q2 at emitter E4) now has a value of 0.2 V, i.e., VB(Q2)−$V_{BLC}$=0.6−0.4=0.2 volts, hence having negligible current flowing to BLC, and $V_{BE\;2}$ is 0.0 V, i.e., VB(Q2)−$V_{EE}$=0.6−0.6=0.0 volts (Q2 is turned off). Thus, base-emitter voltage results here are 0.6 volts across the BLT transistor Q1 and only 0.2 V across the BLC transistor Q2 resulting in the current through the BLT line 75 to be about a million times greater than the current through the BLC 85. There is negligible current flow in the bitlines of the non-selected cells.

A further operation employing the complementary Bipolar SRAM cell 100 of FIG. 4 is to write a bit value to a selected cell. For purposes of description, it is assumed that the cell is selected and BJT transistor Q1 is turned on, and BJT transistor Q2 is turned off. Here, the wordline voltage 95 has been raised to 1 V, i.e., $V_{WL}$=1.0 V and the $V_{EE}$ is about 0.6 V. In doing this, the "on" transistor Q1 has base voltage VB(Q1)=1V, while the "off" transistor Q2 has base voltage VB(Q2)=0.6 V. As before, the cell 100 is assumed at a state where the $V_{BE\ 1}$ (i.e., base-emitter voltage at Q1 emitter E1) is a value 0.4 V, i.e., VB(Q1)–$V_{EE}$=1.0–0.6=0.4 volts (Q1 is turned on). Further, the $V_{BE\ 2}$ value is 0.0 V, i.e., VB(Q2)–$V_{EE}$=0.6–0.6=0.0 volts (Q2 is turned off).

In this embodiment, to write a selected cell requires turning BJT transistor Q1 off and BJT transistor Q2 on. Thus, the bit line truth voltage $V_{BLT}$ 75 is set to remain at its standby value, e.g., $V_{BLT}$ is at a standby value=1.0 V. Then, to perform the write, the BLC voltage 85 is lowered to the standby mode value of $V_{EE}$=0.0 V. In this manner, the $V_{BE\ 4}$ (i.e., base-emitter voltage at Q2 emitter E4) now has a value of 0.6 V, i.e., VB(Q2)–$V_{BLC}$=0.6–0.0=0.6 volts. Thus, VBE(E4) is now larger than VBE(E1), forcing Q2 to turn on and Q1 to turn off. Here, transistor Q2 is forced to turn on and carries about a million times more current than the BJT transistor Q1 which is now turned off. To complete the writing, the voltage at BLC 85 is increased back to its standby value (1 V), and $V_{WL}$ and $V_{EE}$ are returned to their standby voltage values.

Figure 6B:
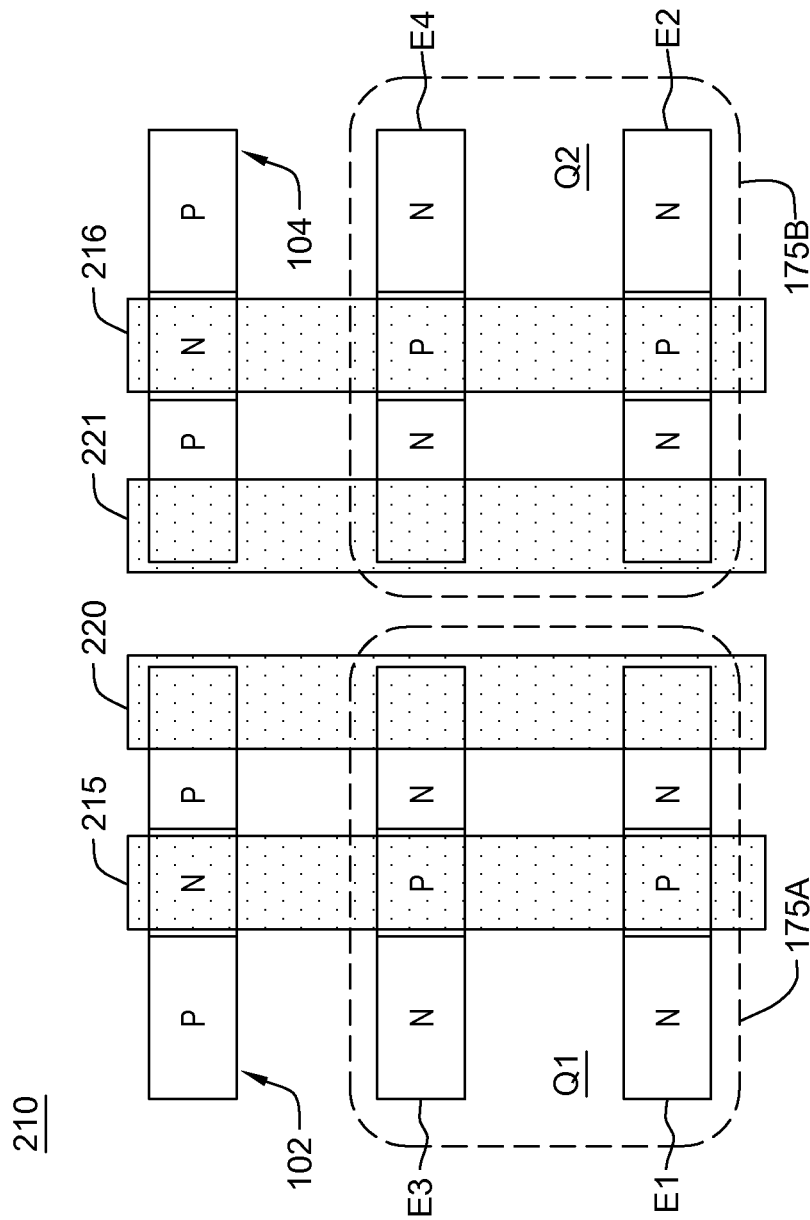
FIG. 6B shows results of semiconductor processing 210 to form a first level metal layer (M1) layout for the Complementary Bipolar SRAM cell of FIG. 4.
Figure 6C:
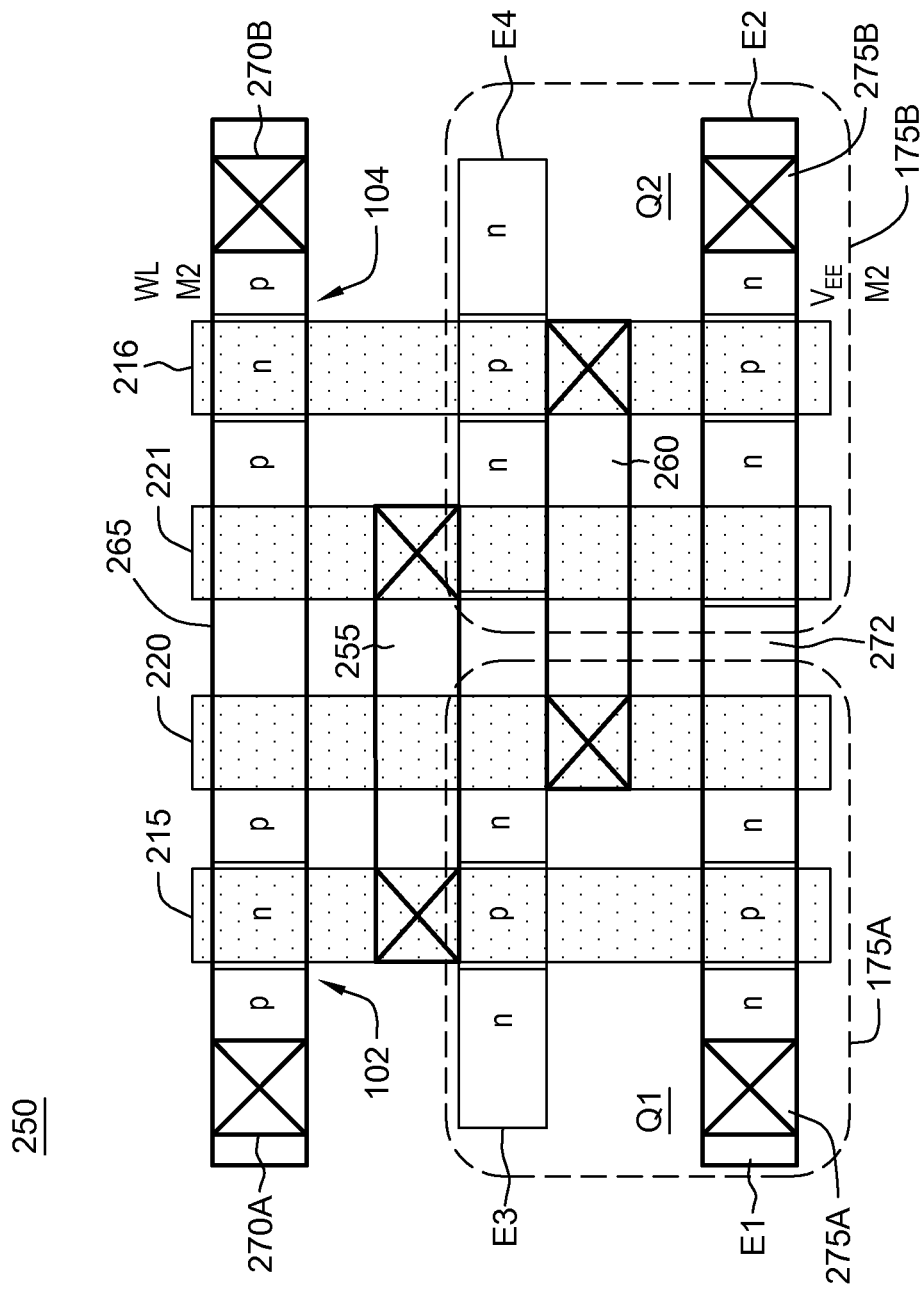
FIG. 6C shows results of semiconductor processing 250 to form a second level metal layer (M2) layout for the Complementary Bipolar SRAM cell of FIG. 4.

FIGS. 6A-6C shows a methodology 200 for building the SOI lateral bipolar junction transistor (BJT) memory cell 100 of FIG. 4 in one embodiment. In FIG. 6A, the method includes forming, using standard lithography and semiconductor manufacturing technique, a layout of the transistors in the cell 100, e.g., on a semiconductor (SOI) substrate, forming the device 100. As shown in FIG. 6A, prior to putting on metal layers, the method includes forming the first PNP device 102 and second PNP device 104, and forming the multi-emitter NPN BJT transistor device Q1 175A having emitter terminals labeled E3, E1 and forming multi-emitter NPN BJT transistor device Q2 175B having emitter terminals labeled E4, E2.

FIG. 6B shows results of semiconductor processing 210 to form a first level metal layer (M1) layout. First, a metal M1 conductor connector 215 is formed according to processes known in the art to electrically connect the base terminal of the PNP transistor 102 to the common base terminals of the NPN transistor Q1; and a further M1 metal conductor connection 220 is formed according to processes known in the art to electrically couple the collector terminal of the PNP transistor 102 to the common collector terminals of the NPN transistor Q1. Likewise, an M1 metal conductor connector 216 is formed according to processes known in the art to electrically connect the base terminal of the PNP transistor 104 to the common base terminals of the NPN transistor Q2; and a further M1 metal conductor connection 221 is formed according to processes known in the art to electrically couple the collector terminal of the PNP transistor 104 to the common collector terminals of the NPN transistor Q2. For clarity of illustration, it is understood that underlying contact vias are not shown in FIG. 6B.

FIG. 6C shows results of semiconductor processing 250 to form a second level metal layer (M2) layout. The M2 layers provide for the cross coupling of the left half inverter 150 and right half inverter 160 as shown in FIG. 4. In this processing, a metal M2 conductor layer 255 is formed according to processes known in the art to electrically connect only the M1 conductor line 215 (coupled to base terminal of the PNP transistor 102 and the common base terminals of the NPN transistor Q1) to the M1 conductor layer 221 (coupled to the collector terminal of the transistor 104 and the common collector terminals of the NPN transistor Q2). Likewise, in this processing, a metal M2 conductor layer 260 is formed according to processes known in the art to electrically only connect the M1 conductor line 220 (coupled to the collector terminal of the PNP transistor 102 and the common collector terminals of the NPN transistor Q1) to only the M1 conductor layer 216 (coupled to the base terminal of the transistor 104 and the common base terminals of the NPN transistor Q2).

FIG. 6C shows further results of semiconductor processing 250 to form the metal layer (M2) layout for wordline conductor line WL 95 and $V_{EE}$ voltage line of circuit 100 of FIG. 4. This further processing includes: forming the wordline WL as a single metal M2 conductor layer 265 that only connects to each emitter terminal of the formed respective PNP transistors 102 and 104 at respective contact conductors 270A, 270B; and forming the $V_{EE}$ voltage supply line as a single metal M2 conductor layer 272 that only connects to each E1, E2 emitter terminals of the formed respective NPN transistors 175A and 175B at respective metal contact conductors 275A, 275B.

Figure 6D:
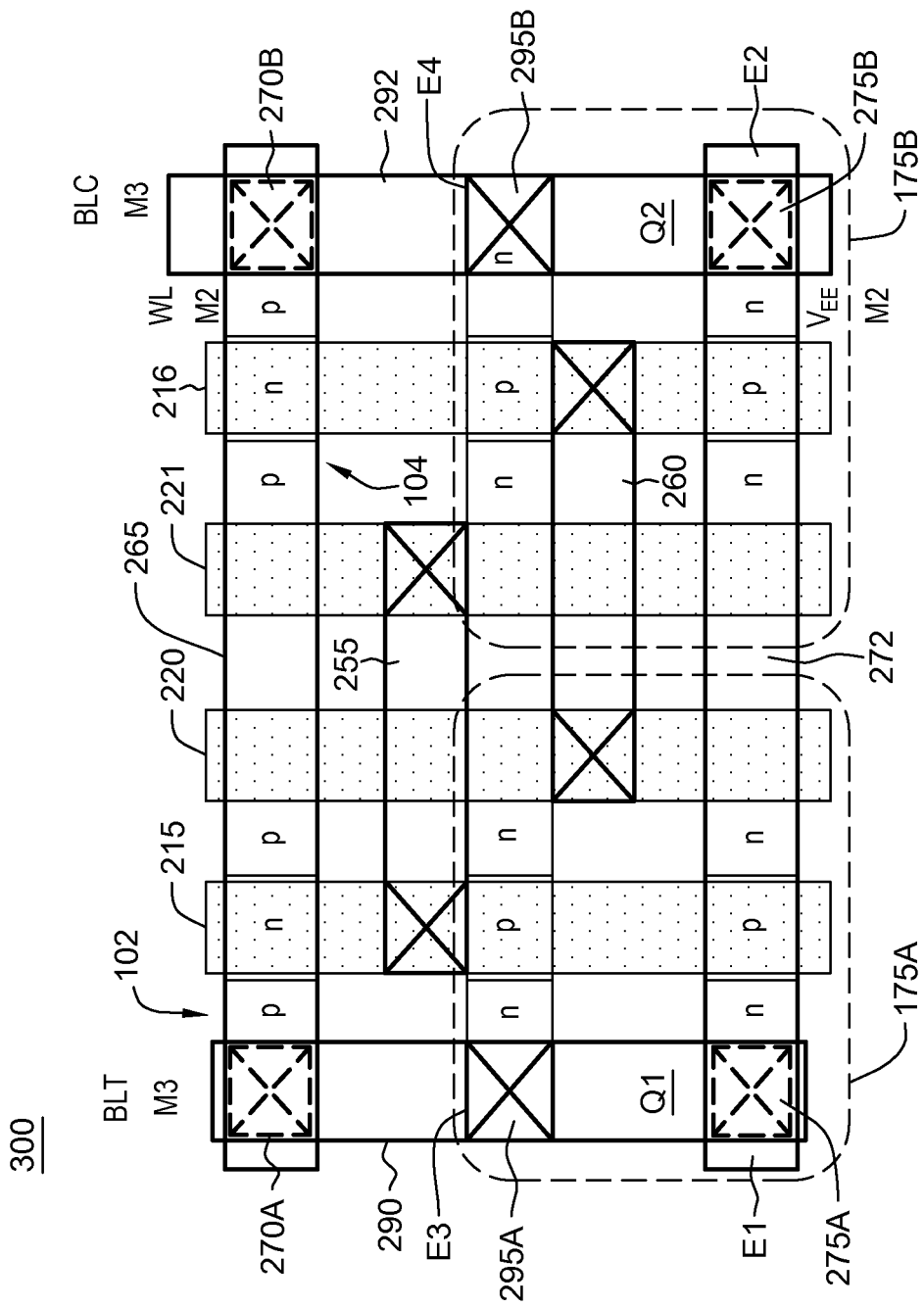
FIG. 6D shows results of semiconductor processing 300 to form a third level metal layer (M3) layout for the Complementary Bipolar SRAM cell of FIG. 4.

FIG. 6D shows results of semiconductor processing 300 to form the metal layer (M3) layout for BLT 75 and BLC 85 conductor lines of the circuit 100 of FIG. 4. This further processing includes: forming the BLT bitline 75 as a metal M3 conductor layer 290 that connects only to emitter terminal E3 of the formed NPN transistor Q1 at a contact conductor 295A; and forming the BLC bitline 85 as a metal M3 conductor layer 292 that connects only to emitter terminal E4 of the formed NPN transistor Q2 at a contact conductor 295B.

Figure 7:
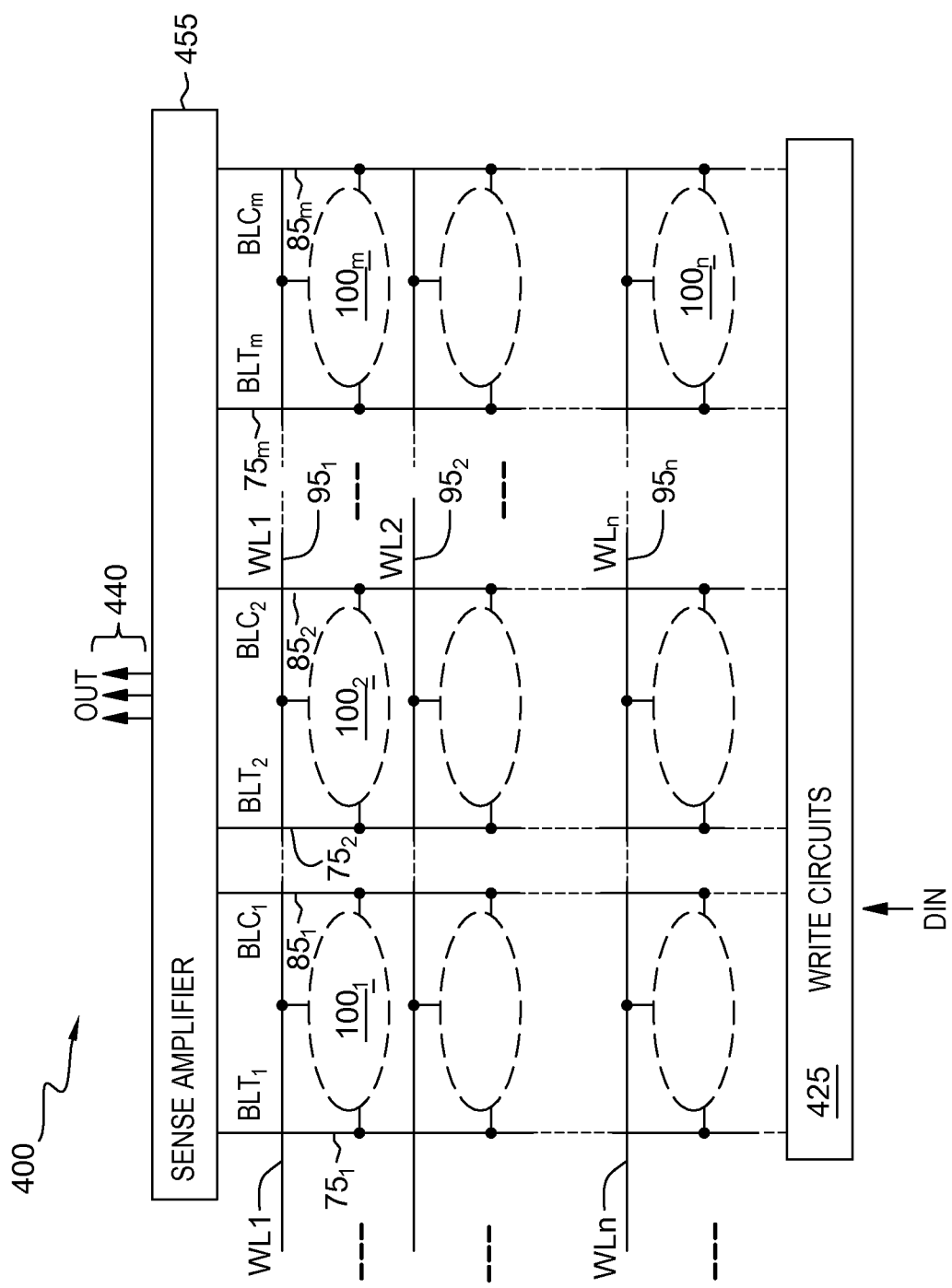
FIG. 7 illustrates a circuit depiction of a memory system 400 that includes an SOI substrate and an array of memory cells $100_1$, $100_2$, ..., $100_n$.

In a further embodiment, as shown in FIG. 7, there is provided a circuit depiction of a memory system 400 that includes an SOI substrate and an array of memory cells $100_1$, $100_2$, ..., $100_n$. Each of the memory cells $100_1$, $100_2$, ... $100_n$ comprising the complementary SOI lateral bipolar SRAM structure 100 such as shown in FIGS. 4-6 (with $V_{EE}$ voltage line connections not shown for clarity). The array 400 includes a plurality of wordlines, $95_1$, $95_2$, ..., $95_n$ having plural cells connected thereto, and a plurality of bitline true (BLT) lines $75_1$, $75_2$, ..., $75_m$ and corresponding bitline complement (BLC) lines $85_1$, $85_2$, ..., $85_m$. Each cell 100 is connected to a respective bitline true line (BLT) and bitline complement (BLC) line in the manner as described. For example, memory cells $100_1$, $100_2$, ... $100_m$ are shown selectable with a wordline $WL_1$. As shown in FIG. 7, the memory cell array of 400 is coupled to a write circuit 425 for applying the WL, $V_{EE}$, BLT and BLC values in a manner as described herein to program a logic value into the selected memory cell 100 based on a data input, e.g., $D_{IN}$. When a wordline WL is selected for reading, each coupled cell provides a differential output signal at respective coupled Bitline True (BLT) and Bitline Complement (BLC) lines. For example, when read, memory cell $100_1$ provides the stored memory cell value at respective BLT and BLC lines $75_1$ and $85_1$; memory cell $100_2$ provides the stored bit value of that memory cell at respective BLT and BLC lines $75_2$ and $85_2$, etc., including a last stored bit value of the memory cell $100_m$ at respective BLT and BLC lines $75_m$ and $85_m$. In one embodiment, a sense amplifier circuit 455, i.e., a cross coupled sense amplifier, connects the array for receiving the differential signal output signals from respective BLT and BLC lines to provide a word output 440, for example.

While various embodiments are described herein, it will be appreciated from the specification that various combinations of elements, variations or improvements therein may be made by those skilled in the art, and are within the scope of the invention. In addition, many modifications may be made to adapt a particular situation or material to the teachings of the invention without departing from essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method of operating a memory cell, the memory cell comprising:
 a first set of lateral bipolar transistors fabricated on a semiconductor substrate, the first set of lateral bipolar transistors forming a first inverter device, and a second set of lateral bipolar transistors fabricated on the semiconductor substrate, the second set of lateral bipolar transistors forming a second inverter device, the first inverter device and second inverter device in a cross-coupled configuration to store a logic state;
 a first bipolar transistor of each said first set and second set being an PNP type bipolar transistor having a base terminal, an emitter terminal and a collector terminal, and a second bipolar transistor of each said first set and second set being a NPN type bipolar transistor having a base terminal, a first emitter terminal, a second emitter terminal, and a collector terminal,
 a first conductor electrically coupling an emitter terminal of said PNP type transistor of said first inverter device and said emitter terminal of said PNP type transistor of said second inverter device, said first conductor adapted to receive a first applied voltage; and
 a second conductor electrically coupling the first emitter terminal of said NPN transistor of said first inverter device and the first emitter terminal of said NPN transistor of said second inverter device, said second conductor adapted to receive a second applied voltage,
 wherein said second emitter terminal of said NPN bipolar transistor of said first inverter device is electrically coupled to a bit line true conductor (BLT) for controlling electrical impedance from the first inverter to said BLT conductor, and said second emitter terminal of said NPN bipolar transistor of said second inverter device is electrically coupled to a bit line complement conductor (BLC) for controlling electrical impedance from the second inverter device to said BLC conductor, each said BLT and BLC conductors used to access said stored logic state, wherein said method comprises:
 applying a first voltage to said first conductor;
 applying a second voltage to said second conductor, wherein one NPN type transistor of either said first inverter device or second inverter device becomes activated responsive to application of said first voltage and second voltage such that electrical current flows through said first emitter terminal of said activated NPN transistor device to said second conductor, and
 applying a further voltage to each said respective said BLT conductor and BLC conductor to write a logic state value to or read a logic state value from said memory cell.

2. The method of operating a memory cell of claim 1, comprising:
 placing said memory cell in a standby state with one NPN bipolar transistor of either said first inverter device or second inverter device in said activated state, said placing comprising:
 applying a first voltage to said first conductor, and
 applying said second voltage to said second conductor such that said applied first voltage is of a value greater than a value of said second voltage;
 applying a voltage at each respective said BLT conductor and BLC conductor at a value such that no current flows from said second emitter terminal of said NPN bipolar transistor of said first inverter device to said bit line true (BLT) conductor, and no current flows from said second emitter terminal of said NPN bipolar transistor of said second inverter device to said bit line complement (BLC) conductor.

3. The method of operating a memory cell of claim 2, wherein said applied first voltage is greater than said applied second voltage by a value of at least a multiple of a quantity kT/q volts where k is a Boltzmann constant, T is a temperature value, and q is an electrical charge.

4. The method of operating a memory cell of claim 3, wherein a plurality of memory cells are connected to said wordline conductor, said method further comprising:
 selecting said plurality of memory cells on the wordline, said selecting comprising:
 maintaining a voltage applied at each respective said BLT conductor and BLC conductor at their standby state voltage level values;
 raising said first voltage applied to said first conductor to a raised first voltage value, and
 raising said second voltage applied to said second conductor to a raised second voltage value, said raised first voltage and raised second voltage values being such that no current flows through said second emitter terminal of said NPN bipolar transistor of said first inverter device to said bit line true (BLT) conductor, and no current flows from said second emitter terminal of said NPN bipolar transistor of said second inverter device to said bit line complement (BLC) conductor, and
 one NPN bipolar transistor of either said first inverter device or second inverter device being in an activated state and providing a current flow from said first emitter terminal to said second conductor while the other NPN bipolar transistor of either said second inverter device or first inverter device is non-activated.

5. The method of operating a memory cell of claim 4, further comprising:
 reading a logic state value stored within a selected cell, said reading comprising:
 reducing the voltage values applied at each respective said BLT conductor and BLC conductor to below their standby state voltage level values, said reduced voltage applied at each respective said BLT conductor and BLC conductor being such that each said NPN bipolar transistor of one of said first inverter device or second inverter device remains activated, wherein, for said activated NPN bipolar transistor, a current flows from said second emitter terminal of said activated NPN bipolar transistor to its coupled said BLT conductor or BLC conductor; and for a non-activated NPN bipolar transistor, a negligible current flows from said second emitter terminal to its coupled said BLC conductor or BLT conductor.

6. The method of operating a memory cell of claim 5, wherein a voltage at a base terminal of said activated NPN bipolar transistor is substantially equal to said raised first voltage value, and a voltage at a base terminal of said non-activated NPN bipolar transistor is substantially equal to said raised second voltage value, wherein a voltage applied across said base terminal and second emitter terminal of said activated NPN bipolar transistor is approximately equal to a voltage difference between the raised first voltage value and the lowered voltage value of its coupled one of: BLT or BLC conductor, and a voltage applied across said base terminal and second emitter terminal of said non-activated NPN bipolar transistor is approximately equal to a voltage difference between the raised second voltage value and the lowered voltage value applied at its coupled one of: BLC or BLT conductor.

7. The method of operating a memory cell of claim 4, further comprising:

writing a logic state value for storage within a selected cell, said writing comprising:

deactivating the one NPN bipolar transistor of either said first inverter device or second inverter device that is in said activated state, and activating the other NPN bipolar transistor of either said second inverter device or first inverter device that is in said non-activated state.

8. The method of operating a memory cell of claim 7, wherein said deactivating the one activated NPN bipolar transistor comprises:

maintaining said one of said BLT or BLC voltage value applied at the respective BLT conductor or BLC conductor coupled to said second emitter terminal of said activated NPN bipolar transistor when in said standby state;

reducing the other one of BLC or BLT voltage value applied at the respective BLC or BLT conductor coupled to said second emitter terminal of said non-activated NPN bipolar transistor to a voltage value equal to said second voltage value applied to said second conductor when in said standby state, thereby activating said non-activated NPN bipolar transistor and deactivating the one activated NPN bipolar transistor.

9. The method of operating a memory cell of claim 8, further comprising:

returning said other one of BLC or BLT voltage value applied at the respective BLC or BLT conductor coupled to said second emitter terminal of said activated NPN bipolar transistor to its standby voltage value; and applying the first voltage to said first conductor at its standby state value, and applying said second voltage to said second conductor at said standby state value such that said applied first voltage is of a value greater than a value of said second voltage.

* * * * *